(12) United States Patent
Nguyen

(10) Patent No.: US 12,119,833 B2
(45) Date of Patent: Oct. 15, 2024

(54) DATA-WEIGHTED ELEMENT MISMATCH SHAPING IN DIGITAL TO ANALOG CONVERTERS

(71) Applicant: Analog Devices, Inc., Wilmington, MA (US)

(72) Inventor: Khiem Quang Nguyen, Tewksbury, MA (US)

(73) Assignee: Analog Devices, Inc., Wilmington, MA (US)

( * ) Notice: Subject to any disclaimer, the term of this patent is extended or adjusted under 35 U.S.C. 154(b) by 231 days.

(21) Appl. No.: 17/877,375

(22) Filed: Jul. 29, 2022

(65) Prior Publication Data

US 2024/0039547 A1 Feb. 1, 2024

(51) Int. Cl.
*H03M 1/06* (2006.01)
*H03M 1/66* (2006.01)

(52) U.S. Cl.
CPC ........ *H03M 1/0604* (2013.01); *H03M 1/0665* (2013.01); *H03M 1/66* (2013.01)

(58) Field of Classification Search
CPC .... H03M 1/0604; H03M 1/0665; H03M 1/66; H03M 3/00; H03M 3/50
See application file for complete search history.

(56) References Cited

U.S. PATENT DOCUMENTS

| | | | |
|---|---|---|---|
| 6,522,277 B2 | 2/2003 | Fujimori et al. | |
| 6,697,003 B1 | 2/2004 | Chen | |
| 7,193,548 B2 | 3/2007 | Kaplan | |
| 7,205,913 B2 | 4/2007 | Adams et al. | |
| 7,916,058 B1 | 3/2011 | Balachandran | |
| 8,842,032 B2 | 9/2014 | Nguyen et al. | |
| 9,136,853 B2 | 9/2015 | Sosio et al. | |
| 9,438,268 B2 | 9/2016 | Mitani et al. | |
| 10,158,374 B1 | 12/2018 | Lai et al. | |
| 2010/0277355 A1 | 11/2010 | Chen | |
| 2014/0152480 A1* | 6/2014 | Nguyen | H03M 1/66 341/144 |

OTHER PUBLICATIONS

Kester, *ADC Architectures III: Sigma-Delta ADC Basics*, MT-022 Tutorial, Analog Devices, Rev. A, Oct. 2008, 12 pages.
Bryant et al., *Chapter 3: Data Converter Architectures, Section 3.1: DAC Architectures*, Data Converter Architectures, 3.1 DAC Architectures, 140 pages.

* cited by examiner

*Primary Examiner* — Joseph J Lauture
(74) *Attorney, Agent, or Firm* — Schwegman Lundberg & Woessner, P.A.

(57) ABSTRACT

Embodiments of the disclosure provide improved mismatch shaping for a digital to analog converter, the method including splitting an original input of a circuit into a plurality of time interleaved data streams; element rotation selection (ERS) logic to process the plurality of time interleaved data streams; and directing one of the plurality of time interleaved data streams to the ERS logic according to a decision of a data-weighted sigma-delta (SD) modulator. In other example implementations, the method can further include multiplexing one of the plurality of time interleaved data streams to be provided to a barrel shifter. In yet other examples, the method can include monitoring a difference between the plurality of time interleaved data streams as a basis for the directing such that a data sample rate for the digital to analog converter is reduced over a time interval.

20 Claims, 14 Drawing Sheets

DATA-WEIGHTED ELEMENT MISMATCH SHAPING IN DIGITAL TO ANALOG CONVERTERS

TECHNICAL FIELD OF THE DISCLOSURE

The present disclosure relates generally to digital-to-analog converters and, more particularly, to methods, circuits, and systems for data-weighted element shaping in digital-to-analog converters.

BACKGROUND

Multibit sigma-delta (IA) digital-to-analog converters (DACs) are typically used to reconstruct analog signals in a stand-alone digital-to-analog conversion or, alternatively, as a part of an analog-to-digital conversion circuit. The mismatch of the uniformly weighted analog elements in this type of DAC (because of circuit imperfections) can introduce harmonic distortions that can degrade the performance of the converter. Dynamic element matching (DEM) techniques have been used to improve the converter signal-to-noise ratio by either spectrally flattening out or converting the harmonic distortions into high-passed noise, which is beyond the signal bandwidth. As a result, the signal-to-noise ratio (SNR) and total-harmonic-distortion (THD) of the converter can be improved.

Analog signals that have practical applications (e.g., temperature, pressure, sound, images, etc.) are commonly converted to a digital representation that can be easily processed in modern digital systems. In many systems, this digital information is converted back to an analog form to perform real-world functions. DACs are the circuits that can perform these operations, where their outputs may be used to drive a variety of devices. Loudspeakers, video displays, motors, mechanical servos, radio frequency (RF) transmitters, and temperature controls are just a few diverse example applications. DACs can be incorporated into digital systems in which real-world signals are digitized by analog-to-digital converters (ADCs), processed, and then converted back to analog form by DACs. One factor affecting the performance of DACs relates to a variation or a "mismatch" in performance of individual elements of a DAC.

Overview

Embodiments of the present disclosure provide mechanisms for digitally correcting or minimizing a mismatch of a given DAC, which can be part of a larger system. Methods, circuits, and systems are provided to offer first-order mismatch error shaping solutions for any number of example architectures. In certain embodiments, implementations discussed herein can provide solutions that are free of idle tones, while also achieving consistently lower power consumption. Additionally, such example solutions can provide a minimal level of hardware complexity, while offering robust performance in many digital-to-analog systems. Some example implementations discussed herein can be applicable to both two and three level unit element data converters (ADC and DAC). In addition, such example solutions disclosed herein can work sufficiently well with low oversampling ratios.

In certain other scenarios, mechanisms described herein may be applicable to current steering, as well as switched capacitor DACs implemented using various architectures (e.g., sigma-delta systems, Nyquist DAC architectures, etc.). Also, some of the mechanisms described in this Specification may be especially attractive for oversampling sigma-delta audio DAC applications. Furthermore, mechanisms described herein are flexible in their applications, as they could readily be provisioned in single-level DACs, two-level DACs, three-level DACs, etc.

In Example 1, one aspect of the present disclosure provides a method for mismatch shaping for a digital to analog converter, the method including splitting an original input of a circuit into a plurality of time interleaved data streams; element rotation selection (ERS) logic to process the plurality of time interleaved data streams; and directing one of the plurality of time interleaved data streams to the ERS logic according to a decision of a data-weighted sigma-delta (SD) modulator.

In Example 2, the method according to Example 1 may further include multiplexing one of the plurality of time interleaved data streams to be provided to a barrel shifter. In Example 3, the method according to Example 1 may further include monitoring a difference between the plurality of time interleaved data streams as a basis for the directing such that a data sample rate for the digital to analog converter is reduced over a time interval. In Example 4, the method according to Example 1 may further include disabling a path associated with one of the plurality of time interleaved data streams such that content associated with the path is zeroed out.

In Example 5, the method according to Example 1 may further include multiple ERS logic being configured to receive the plurality of data interleaved streams. In Example 6, the method according to Example 1 may further include using the ERS logic output to drive a digital-to-analog converter (DAC) unit for analog reconstruction. In Example 7, the method according to Example 1 may further include that the ERS logic includes a multiplexed path to process the plurality of time interleaved data streams. In Example 8, the method according to Example 1 may further include the directing of plurality of time interleaved data streams being performed at a multiplexer, which can use an input to output data to a barrel shifter.

In Example 9, another aspect of the present disclosure provides an element rotation selection (ERS) system for mismatch shaping, the ERS system including a first sub-ERS logic; a second sub-ERS logic; a first DAC coupled to the first sub-ERS logic; a second DAC coupled to the second sub-ERS logic, wherein the first and second DACs are to receive an output of the first and second sub-ERS logics to perform a digital to analog conversion; and a data-weighted sigma-delta (SD) modulator configured to: monitor a difference between a data weight of the first and second sub-ERS logic; and select either the first or the second sub-ERS logic to maintain substantially equal usage over time between the first sub-ERS logic and the second sub-ERS logic.

In Example 10, the ERS system of Example 9 may further include that the data-weighted SD modulator provides that input weights that move toward two different branches within the ERS system are substantially equal over time. In Example 10, the ERS system of Example 9 may further provide that an output at the first and second sub-ERS logic is in a digital form that is being converted into an analog form via the first and second DACs. In Example 12, the ERS system of Example 9 may further provide that the first sub-ERS logic and the second sub-ERS logic drive resultants for the first DAC and the second DAC. In Example 13, the ERS system of Example 9 may further include that if one of the first and second sub-ERS logic is not used, its corresponding content is not updated. Example 14, the ERS system of Example 9 may further include that the first DAC and the second DAC are a same physical DAC. Example 15, the ERS system of Example 9 may further include a dither to provide a tone free result for a decision sequence associated with the selection of the first or the second sub-ERS logic.

In a separate Example 16, any of the aforementioned examples can be provisioned via a non-transitory computer readable storage medium storing software code portions configured for, when executed on a processor, mismatch shaping for a digital to analog converter, as described above. Additionally, any of the previous examples may be readily included in a system on chip (SOC) package, either in part, or in whole.

As can readily be appreciated by those skilled in the art, aspects of the present disclosure may be embodied in various manners (e.g., as a method, a system, a computer program product, a computer-readable storage medium, etc.). Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Functions described in this disclosure may be implemented as an algorithm executed by one or more processing units, e.g., one or more microprocessors, of one or more computers. In various embodiments, different steps, and portions of the steps of each of the methods described herein may be performed by different processing units. Furthermore, aspects of the present disclosure may take the form of a computer program product embodied in one or more computer readable medium(s), preferably non-transitory, having computer readable program code embodied, e.g., stored, thereon. In various embodiments, such a computer program may, for example, be downloaded (updated) to the existing devices and systems (e.g., to the existing DACs or DAC controllers, etc.) or be stored upon manufacturing of these devices and systems.

DESCRIPTION OF EXAMPLE EMBODIMENTS OF THE DISCLOSURE

DAC Operational Overview

Figure 1A:
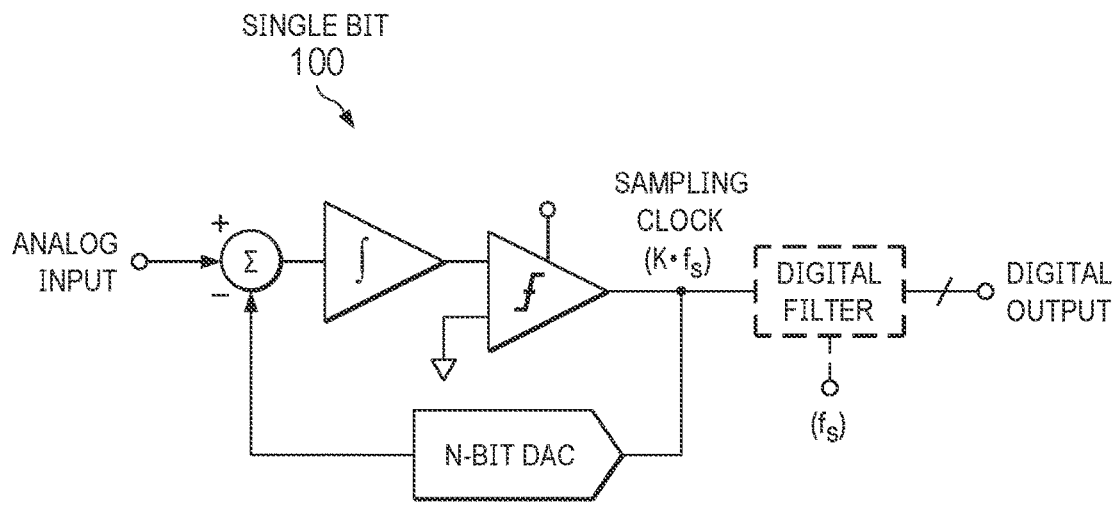
FIGS. 1A and 1B are simplified block diagrams illustrating example implementations for a single bit architecture and a multibit sigma-delta architecture respectively.

In general, a DAC can be thought of as a device that produces a quantized (discrete step) analog output in response to a binary digital input code. The digital input may be, for example, an input from transistor logic (TTL), emitter-coupled logic (ECL), complementary metal-oxide-semiconductor (CMOS) circuits, or low-voltage differential signaling (LVDS), while the analog output may be either a voltage or a current. To generate the output, a reference quantity (either a voltage or a current) can be divided into binary and/or linear fractions. Then the digital input can drive the switch to the individual DAC cells of a DAC, which could comprise current sources, voltage sources, resistors, capacitors, etc. An output can be produced by combining an appropriate number of these fractions, a process sometimes referred to as "encoding." The number and size of the fractions reflect the number of possible digital input codes, which is a function of converter resolution or the number of bits (N) in the digital input code. For example, N bits could result in $2^N$ possible codes.

As used herein, the term "DAC" is broad and inclusive of any analog element (e.g., a current source, a switched capacitor element, etc.) that could deliver an analog quantity such as a charge, a signal, or a current to a next destination. For example, in the context of a two-level current steering DAC, a DAC cell may comprise a DAC element that includes two current sources (e.g., a pMOS and an nMOS current source), as well as two switching mechanisms that could be associated with each of the two current sources (i.e., a total of four switches per DAC cell). In other examples, in the context of a three-level current steering DAC, a DAC cell may comprise a DAC element that includes two current sources (e.g., a pMOS and an nMOS current source), as well as three switching mechanisms that can be associated with each of the two current sources (i.e., a total of six switches per DAC cell). In another context, a DAC cell can be an element that can deliver a charge 'Q' that is equal to the product of a predefined reference voltage 'Vref' and a capacitance 'C.' The polarity of this charge can be defined by the digital input to the DAC cell. These are just some of the many possible configurations that could benefit from the teachings of the example embodiments, as discussed below.

In operation of a typical DAC, a digital signal is provided to a coding element (e.g., an encoder) which, in turn, switches the individual DAC cells on and off to convert digital input values of the digital signal to analog values. The number of DAC cells switched on at the same time represents an analog value of the resulting analog signal at that time. For example, a DAC with 15 DAC units is capable of converting a 4-bit digital value (i.e., N=4) to one of 16 different analog values ($2^N$, so for N=4 the number of possible codes is $2^4$=16) by switching the appropriate DAC units on. For example, to convert a digital value 0110 to an analog value—six DAC units may be switched on, to convert a digital value 0111 to an analog value—seven DAC units may be switched on, to convert a digital value 1001 to an analog value—nine DAC units may be switched on, to convert a digital value 1011 to an analog value—eleven DAC units may be switched on, and so on.

DACs may be differentiated based on modulation schemes applied. Two modulation schemes often used to implement DACs are sigma-delta (sometimes also referred to as "delta-sigma") and Nyquist-rate (or simply "Nyquist"). DACs may also be differentiated based on circuit architectures used. Two circuit architectures often used to implement DACs are current steering DACs and switched capacitor DACs. "Current steering DACs" refer to DACs in which current sources of the DAC cells are steered to generate an analog current output. "Switched capacitor DACs" refer to DACs where capacitors of the DAC cells are connected to different reference voltages to generate an analog voltage output. Current steering DACs may be implemented as two-level or three-level DACs, as described in greater detail below.

Figure 1B:
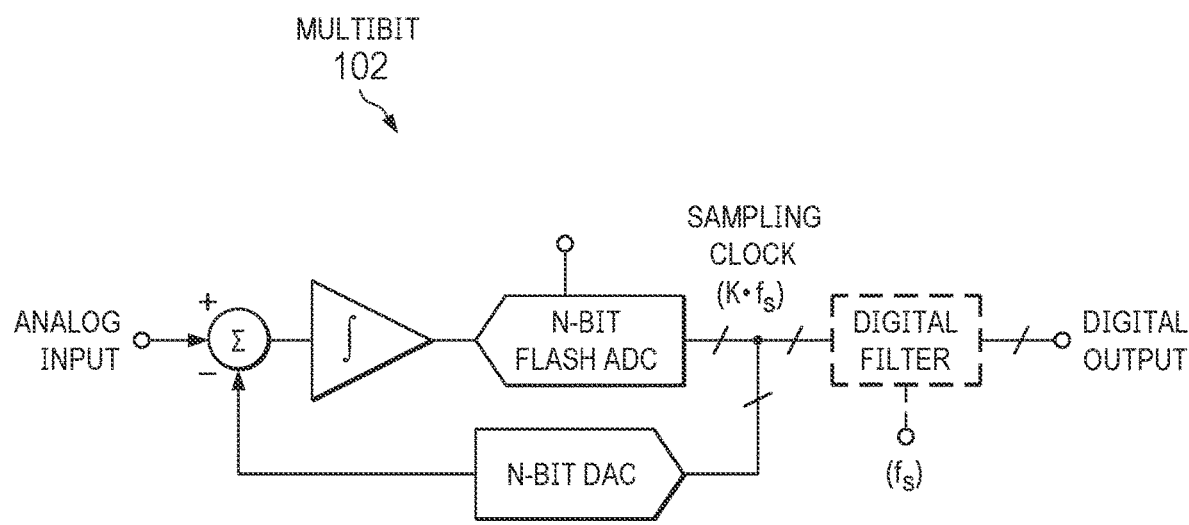

FIGS. 1A and 1B are simplified block diagrams illustrating a typical implementation for a basic single bit and a multibit first-order sigma-delta architecture, respectively. More specifically, FIG. 1A illustrates a single bit architecture indicated generally at 100, which includes an analog input, a sampling clock, a digital filter, a digital output, and a 1-bit DAC. Similarly, FIG. 1B illustrates a multibit architecture indicated generally at 102, which includes an N-bit flash ADC and an N-bit DAC. Note that the integrator operates on the error signal, whereas in a delta modulator, the integrator is in the feedback loop. The basic oversampling sigma-delta modulator increases the overall signal-to-noise ratio at low frequencies by shaping the quantization noise such that most of it occurs outside the bandwidth of interest. The digital filter then removes the noise outside the bandwidth of interest, and the decimator reduces the output data rate back to the Nyquist rate.

The IC sigma-delta ADC can offer several advantages over other architectures, especially for high-resolution, low-frequency applications. Foremost, the single bit sigma-delta ADC is inherently monotonic and does not require laser trimming. The sigma delta ADC also lends itself to low-cost foundry CMOS processes because of the digitally intensive nature of the architecture.

Figure 1C:
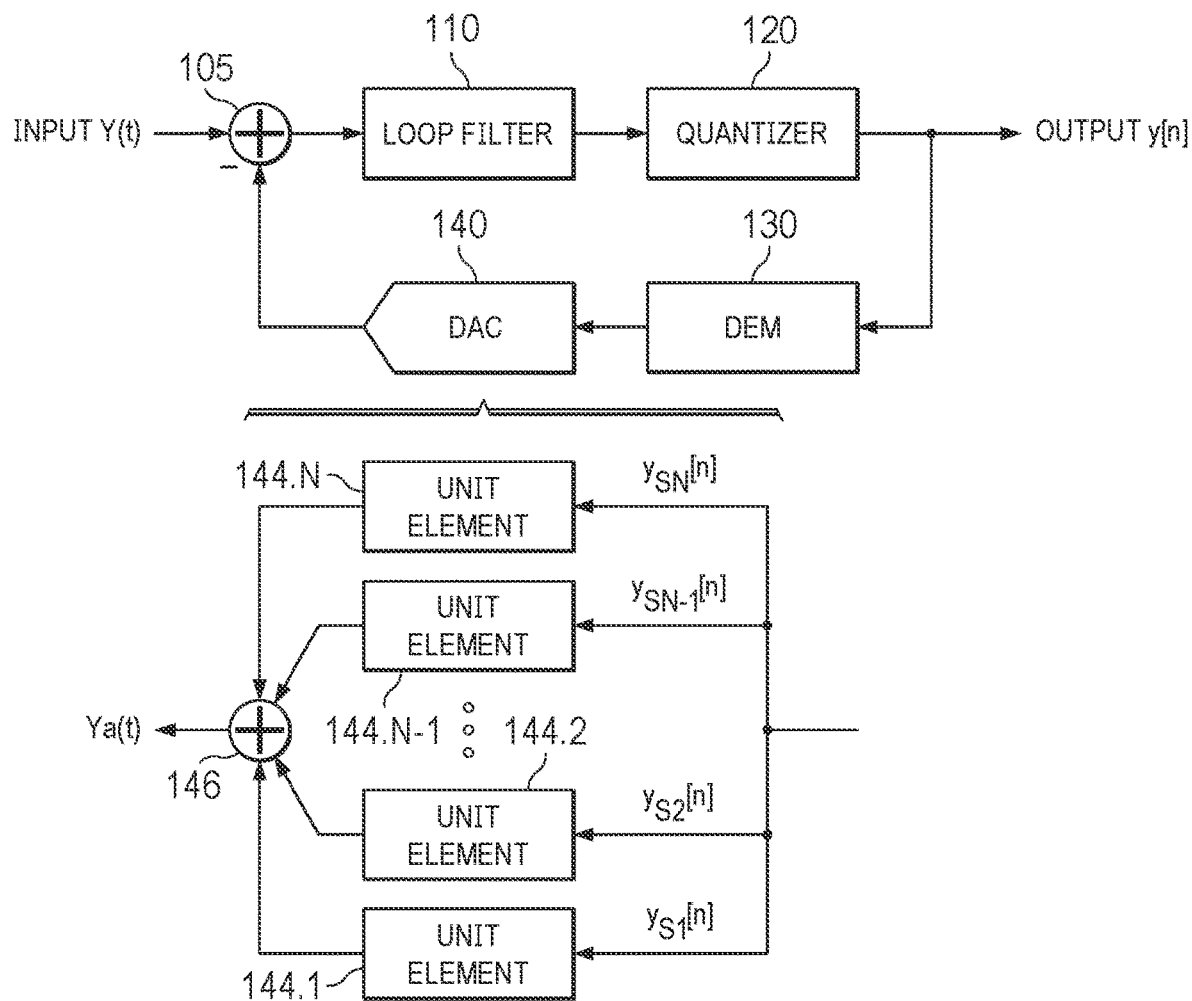
FIG. 1C is a simplified block diagram illustrating an example multibit noise-shaped oversampling analog-to-digital converter.

FIG. 1C is a simplified block diagram illustrating a typical multibit noise-shaped oversampling analog-to-digital converter. This multibit noise-shaped oversampling ADC may include an integrator 105, a loop filter 110, a quantizer 120, a dynamic element matching (DEM) logic block 130, and a feedback DAC 140. Feedback DAC 140 may include a number of unit elements 144.1-144.N and an integrator 146.

Note that in more general terms, an integrator can be thought of as an op amp circuit, whose output is proportional to the integral of input signal. The integrator can be viewed as an inverting amplifier in which a feedback resistor is replaced with a capacitor of a suitable value. The integrators described herein include any type of adder that could be used in various types of architectures.

The ADC may receive an analog input signal y(t) and generate an N-valued digital output y[n], a digital representation of the input signal y(t). The input signal y(t) may be compared to the output ya(t) of DAC 140 via integrator 105. The output signal from integrator 105 can be filtered by loop filter 110, which may effectively perform an integration on the signal output from integrator 105. An output from loop filter 110 may be fed to quantizer 120 that can provide the N-valued digital output y[n].

DEM logic block 130 may map the N-valued digital output y[n] into N 1-bit sequences denoted y.sub.S1[n]-y.sub.SN[n]. The outputs of the DEM logic block may be routed to the unit elements 144.1-144.N. Each of the unit elements 144.1-144.N may convert the signal received from DEM logic block 130 into analog signals and the outputs of each of the unit elements 144.1-144.N may be summed via integrator 146 to produce output signal ya(t). The ADC can include DEM logic block 130 to linearize the element-to-element mismatch. DEM logic block 130 can apply a high pass function on the element 144.1-144.N mismatch error, thus yielding minimal in-band mismatch noise so as not to degrade the SNR of the converter.

Figure 2:
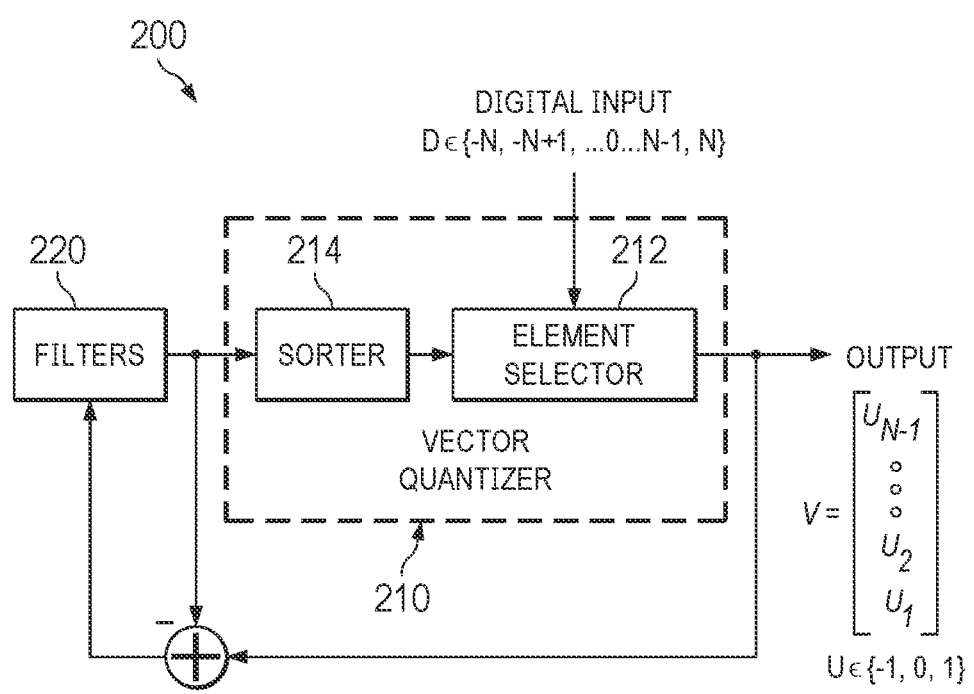
FIG. 2 is a simplified block diagram illustrating a generalized example second order dynamic element matching (DEM) circuit.

FIG. 2 is a simplified block diagram illustrating a generalized second-order dynamic element matching (DEM) circuit indicated generally at 200. The DEM logic may include a vector quantizer 210 and a plurality of filters 220. Vector quantizer 210 may include an element selector 212 and a sorter 214. Vector quantizer 210 can receive a digital input and offer a vector to provide signals for the unit elements (e.g., −1, 0, or 1 for a three-level unit element). One of the disadvantages of vector quantizer 210 is that it takes significant silicon area due to the complexity associated with the sorting algorithm of sorter 214. Many existing implementations of the second-order DEM logic on three-level unit elements may not be effective at low input levels. At low input levels, when only a few unit elements are used, the DEM has few options to correct for the mismatch. Thus, the DEM is susceptible to poor noise shaping of the element mismatch.

Dynamic Element Matching (DEM)

Figure 3:
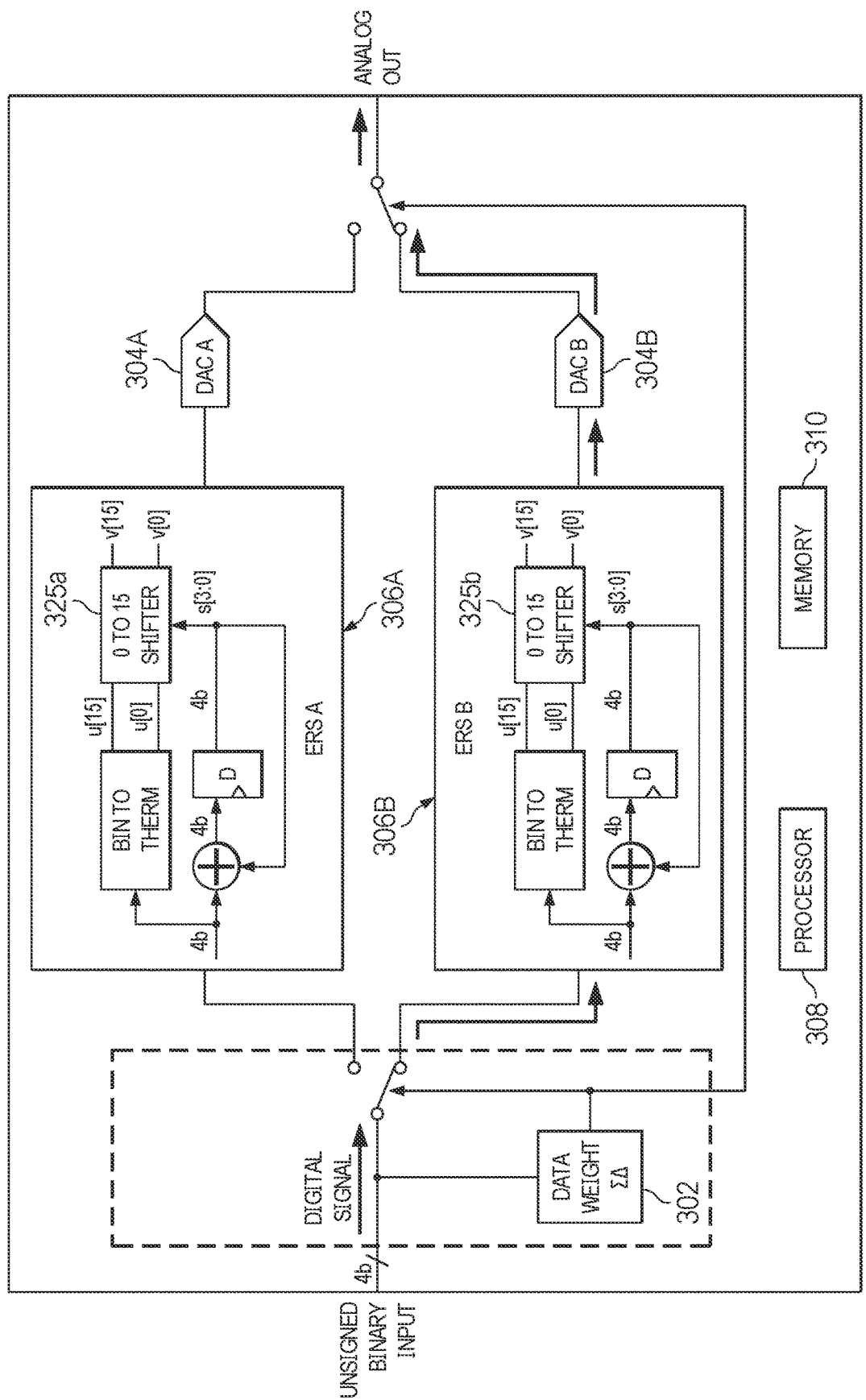
FIG. 3 is a simplified block diagram of an example data-weighted element matching circuit, according to some embodiments of the present disclosure.

Before turning to FIG. 3, it is relevant to understand the environment in which DEM techniques are typically used. DEM is a class of techniques used in integrated circuit (IC) design to compensate for the component mismatch. DEM techniques typically involve some kind of a dynamic process intended to reduce the effects of component mismatches in electronic circuits by dynamically re-arranging the interconnections of mismatched components so that the time averages of the equivalent components at each of the component positions are equal or nearly equal.

One DEM technique, conventionally referred to as "random scrambling DEM," is based on randomizing which DAC cells are turned on for converting each digital value. When random scrambling DEM is used, instead of switching consecutive DAC cells at each point in time (i.e., to convert each digital value), the same number of non-consecutive, randomly selected DAC cells are switched on. Other known DEM methods include, for example, Data Weighted Averaging (DWA) and its variations, vector feedback, and tree structure.

DEM techniques suffer from a drawback where the application of a DEM technique results in unpredictable and uncontrolled pseudo-periodic behavior of the analog output signal. This behavior manifests itself in appearance of tones (i.e., undesired artifacts appearing in the spectrum of an output signal which were not present in the input signal). In sigma-delta DACs, these tones are referred to as "idle tones" and are one of the most commonly encountered effects of non-linearity. It would be desirable to improve on this issue. Furthermore, since power consumption is an issue that engineers continuously try to improve on, it would be desirable to reduce power consumption of a DAC in context of application of various DEM techniques.

Turning to FIG. 3, FIG. 3 is a simplified block diagram of an example data-weighted element matching circuit 300, according to some embodiments of the present disclosure. In this particular non-limiting example, matching circuit 300 may include a data-weight sigma-delta (IA) 302, a DAC A 304A, a DAC B 304B, an element rotation scheme (ERS) A 306A, an ERS B 306B, a processor 308, and a memory 310. ERS logic A 306A, ERS logic B 306B each include a respective barrel shifter 325a, 325b.

The term 'dynamic' in the context of element matching can be thought of as data weighted such that DAC A and DAC B are utilized somewhat equally. This can effectively be achieved by using a sigma delta modulator element, which can be included within data weight IA 302 in certain implementations of the present disclosure. Further, in operation, as data moves to each of the nodes (that are indicated as circles in FIG. 3) and toward ERS A and ERS B, their difference is recorded in the data weight loop (i.e., within data weight $\Sigma\Delta$ 302). The decision being made in data weight $\Sigma\Delta$ 302 attempts to force the input data to one or the other of the input branches to compensate for any difference that was determined between the two ERS elements. These activities are further described below with reference to a number of possible configurations of the present disclosure.

Limitations of ERS and Sigma Delta ADC

By way of context, in the development of an analog to digital converter (e.g., of the sigma delta type, where an oversampling data converter type is considered), within the sigma delta modulator, there is a digital to analog circuit. This can be used as the feedback element for a closed loop. In general, a three-level architecture can be used in many architectures and this can be effective for a continuous time sigma delta ADC. In embodiments discussed herein, the design can offer a switch capacitor analog-to-digital, which is a discrete time system instead of a continuous system.

When implementing an analog-to-digital converter with a switch capacitor, embodiments described herein address a DAC that produces two levels (+1/−1). Because of this parameter, a dynamic element matching algorithm is suitable such that it works with two-level elements. There are many two-level dynamic matching elements but such architectures include many drawbacks. In using common ideas for a 4-bit unsigned data stream, a barrel shifter can be provisioned [according to control logic], along with an integrator and this could create control logic that provides mismatch shaping in several of the elements. However, this creates unwanted idle tones, which is a known problem in such systems. This also creates significant undesirable noise, along with mismatching errors that can occur in-band.

Any ERS or a rotational shuffler is prone to producing a first-order shaped mismatch error. A pointer in the ERS is similar to the error feedback signal in an error-feedback sigma-delta modulation. Note that the pointer indicates the mismatch error of the elements at time t, not necessarily the amplitude of the input signal at the same time. It follows that an ideal spectral content of the pointer is (pseudo) white noise such that the resulting shaped mismatch spectrum is clean of low frequency period tones in the presence of analog element mismatch.

In general, at issue is that for low-digital input levels, the pointer signal can have low frequency content due to the relationship with the digital input. This is a similar phenomenon to the sigma-delta loop with low stochastics when its input is at a low level. Such behavior can result in idle tones in the reconstructed analog out. Some solutions have been proposed to provide group level averaging techniques and bi-directional rotations. Still other flawed systems can take the 16-element ring and break it into two parallel 8-element rings, each controlled by its respective ERS algorithm. This approach would not eliminate idle tones, as each sub-ERS suffers from the same problem as the larger ERS.

Yet another solution may elect to wait for the cumulative error to be zero and then reseed the pointer to decorrelate the mismatch error. This method does not work well for a two-level element, as the event happens too frequently. Thus, more mismatch errors are introduced inadvertently.

Example Implementations of Data-Weighted Element Matching

Embodiments of the present disclosure can offer a number of advancements over existing solutions and, further, address many of the aforementioned challenges for such architectures. In one example implementation, the data-weighted element matching system can create two or more time interleaved data streams from an original input. Additionally, the system can provide two or more separate ERS logic elements. The architecture can direct the input to a corresponding time-interleaved ERS logic according to the decision of a data-weighted sigma-delta (SD) modulator. The SD modulator can be of a first (or higher) order, which can be based on specific configuration needs. The architecture can use the appropriate ERS output to drive the DAC unit element array for a final analog reconstruction.

In operation of an example flow, an unsigned binary input can be sent to either ERS A or ERS B depending on the decision executed by data weight $\Sigma\Delta$ 302. If the decision indicates the data stream is to go to ERS B, then ERS B would update its content with the 4-bit input content. This pathway is being shown by the solid arrow line of FIG. 3. A new pointer would subsequently be provided to a corresponding barrel shifter. The binary data can instantaneously be fed to the Bin to therm element. Theoretically, 16 levels could be constructed within the barrel shifter, where a particular element of the DAC B is being driven. If the signal is −1, then DAC B would be turned off and if the signal is +1, then the DAC B would be turned on. Even though the logic can be 1 or 0, when being converted to analog the resultant would be −1 or +1. Hence, the analog logic domain is −1 and +1, while the digital logic domain is 0 or 1. Subsequently, the output of the digital-to-analog converter is sent to the analog output. At roughly the same time, data is also traveling through the data weight $\Sigma\Delta$ (through one of the illustrated AND logic gates, depending on the comparator logic). Because of this, only one of the integrator's contents will be updated. In a general sense, only when the ERS is used is it being updated.

Hence, the top branch and the bottom branch are being used somewhat equally over time. This helps to eliminate the aforementioned idle tones associated with DAC A and DAC B. Using a rotational scheme for ERS A and ERS B allows for a noncontinuous usage based on the data weighted sigma delta loop. In one example implementation, ERS A and ERS B are associated with 4-bit processing such that their effective sample rate is consistent with each other. Alternatively, these elements can be associated with different bit processing and such design choices may be based on specific circuit needs. By interleaving two different paths, a slower rate for each individual path can be achieved through ERS A and ERS B. Therefore, the data weight sigma delta loop is allowing for the data sample rate to be approximately half of the input clock rate. Due to the reduction of the effective sample rate, the noise transfer function of the mismatch shaping is also similarly experiencing a substantial half-rate reduction. In a general sense, for certain embodiments of the present disclosure, the data weight sigma delta element can ensure that ERS A and ERS B receive equal data weight (or element usage) over time and, hence, first order shapes the gain error.

In operation, the barrel shifter for a positive thermometer input may be (for example) a one-byte register with a shift that controls a positive pointer pointing to a starting position of positive data, and the other barrel shifter for negative thermometer input may also be (for example) a one-byte register with a shift that controls a negative pointer pointing to a starting position of negative data.

In an alternative embodiment, ERS A and ERS B could be collapsed down to 8 processing elements and both could run concurrently, rather than executing a ping ponging between each of these elements. Hence, the sample rate being used by ERS A and ERS B could be fixed at a lower level to resolve many of the identified issues associated with such circuits. In certain non-limiting example implementations, when an ERS is not used, it is not clocked. On other examples, the clock is not used at all for such activities. From a schematic perspective, when the signed binary data is positive, the positive pointer may be updated based on the positive signed binary data. By contrast, when the signed binary data is negative, the negative pointer may be updated based on the negative signed binary data. The mismatch error of an element $u_i$ of a shuffler may be defined as the difference between the actual value of the element and the average value of all the elements.

In operation of another alternative embodiment of FIG. 3, the architecture may comprise a signed thermometer encoder for encoding signed binary data into signed thermometer data and a rotational DEM logic for outputting shuffled signed thermometer data (not specifically shown in FIG. 3). According to another example embodiment of the present disclosure, the rotational DEM logic may further include a DEM decision logic that may convert signed binary data input into positive and/or negative pointer data, a barrel shifter for shifting positive thermometer data input based on the positive pointer data, and a barrel shifter for shifting negative thermometer data input based on the negative pointer data.

An appropriate shuffler can use rotational DEM logic for shuffling signed thermometer data according to some embodiments of the present disclosure. In a multibit, three-level logic sigma-delta DAC, the digital input may include signed binary data. In one example embodiment of the present disclosure, the signed binary data input (e.g., N bit binary data, may be encoded at a signed thermometer encoder into $2^N$ levels of thermometer data. The signed thermometer encoder may encode positive binary data input into positive thermometer data and negative binary data input into negative thermometer data. The signed thermometer data and the signed binary data may be both fed to a rotational DEM functional unit for producing an output of shuffled signed thermometer data.

According to one example embodiment of the present disclosure, the signed thermometer data streams may be first paired up so that each pair can take the value of (+1, 0, or −1). The pairs of data may then be passed through two barrel shifters, where one barrel represents positive data, and one barrel represents negative data. The input of the DEM block may include the signed binary data. The output of the DEM logic block may include two pointers,—one for positive data and one for negative data,—called positive pointer and negative pointer for convenience—, which indicate the current location of the sequence of elements to be used as output.

Figure 4:
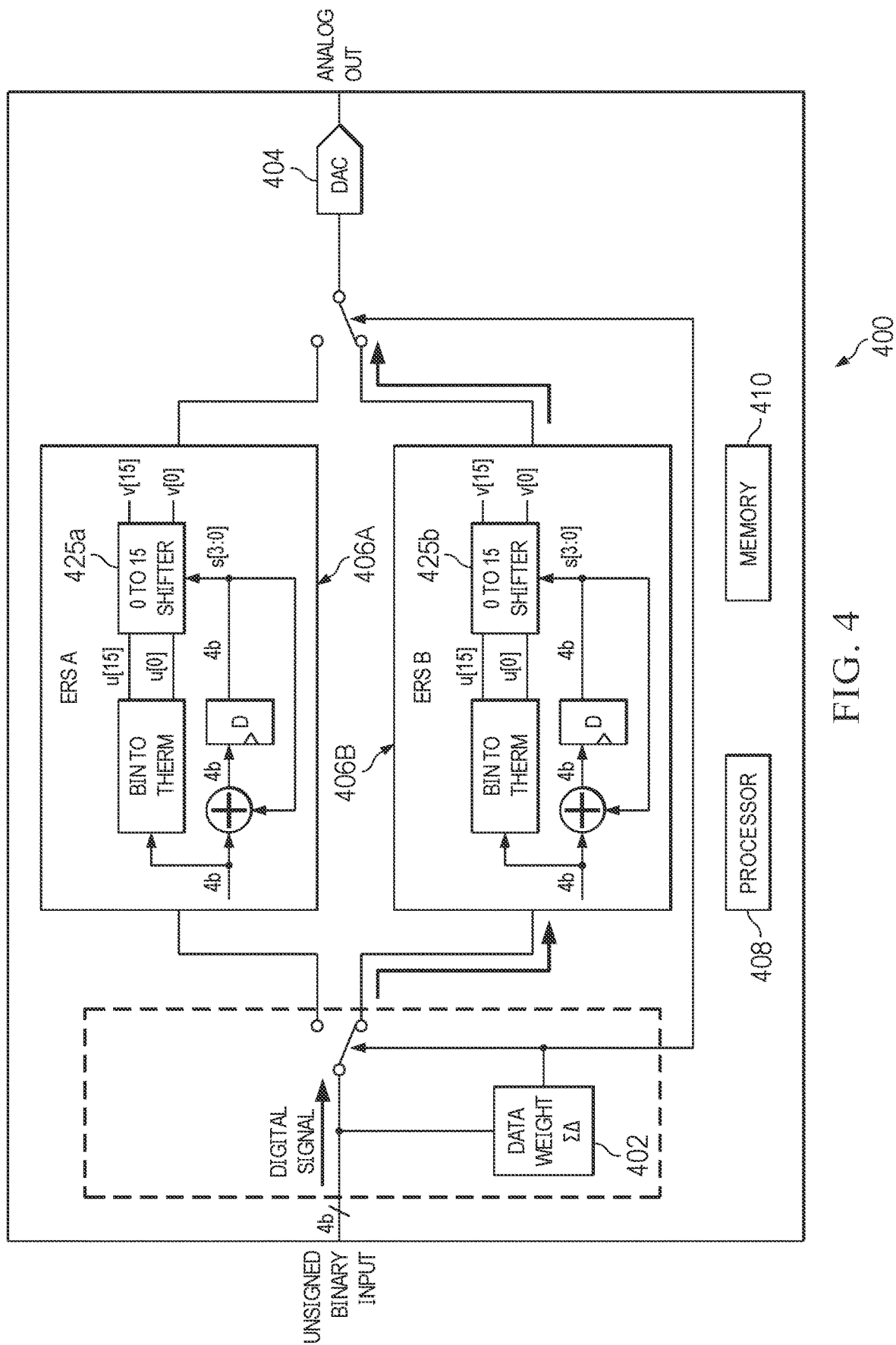
FIG. 4 is a simplified block diagram of a data-weighted time interleaved element rotation scheme (ERS) with a merged digital-to-analog converter, according to some embodiments of the present disclosure.

Turning to FIG. 4, FIG. 4 is a simplified block diagram of a data-weighted time interleaved ERS with a merged digital-to-analog converter (generally indicated at an arrow 400), according to certain embodiments of the present disclosure. This architecture operates in a manner similar to that described above with reference to FIG. 3. The architecture of FIG. 4 may include a data-weight ΣΔ 402, a single DAC A 404, an ERS A 406A, an ERS B 406B, a processor 408, and a memory 410 in this particular non-limiting example.

ERS logic A 406A and ERS logic B 406Bi may each include a respective barrel shifter 425a, 425b. In using the sigma delta modulator element, which can be included within data weight ΣΔ 402, the ERSs can be utilized somewhat equally. Further, as data moves to each of the nodes toward ERS A and ERS B, their difference can be recorded in the data weight loop (i.e., within data weight ΣΔ 402). The decision being made in data weight ΣΔ 402 attempts to force the input data to one or the other of the input branches to compensate for any difference that was determined between the two ERS elements. In an example embodiment, and because ERS A and ERS B are not being used at the same time, DAC A and DAC B can be viewed as the same physical DAC. In yet other embodiments, even more optimizations can be achieved on shared hardware between ERS A and ERS B.

Figure 5:
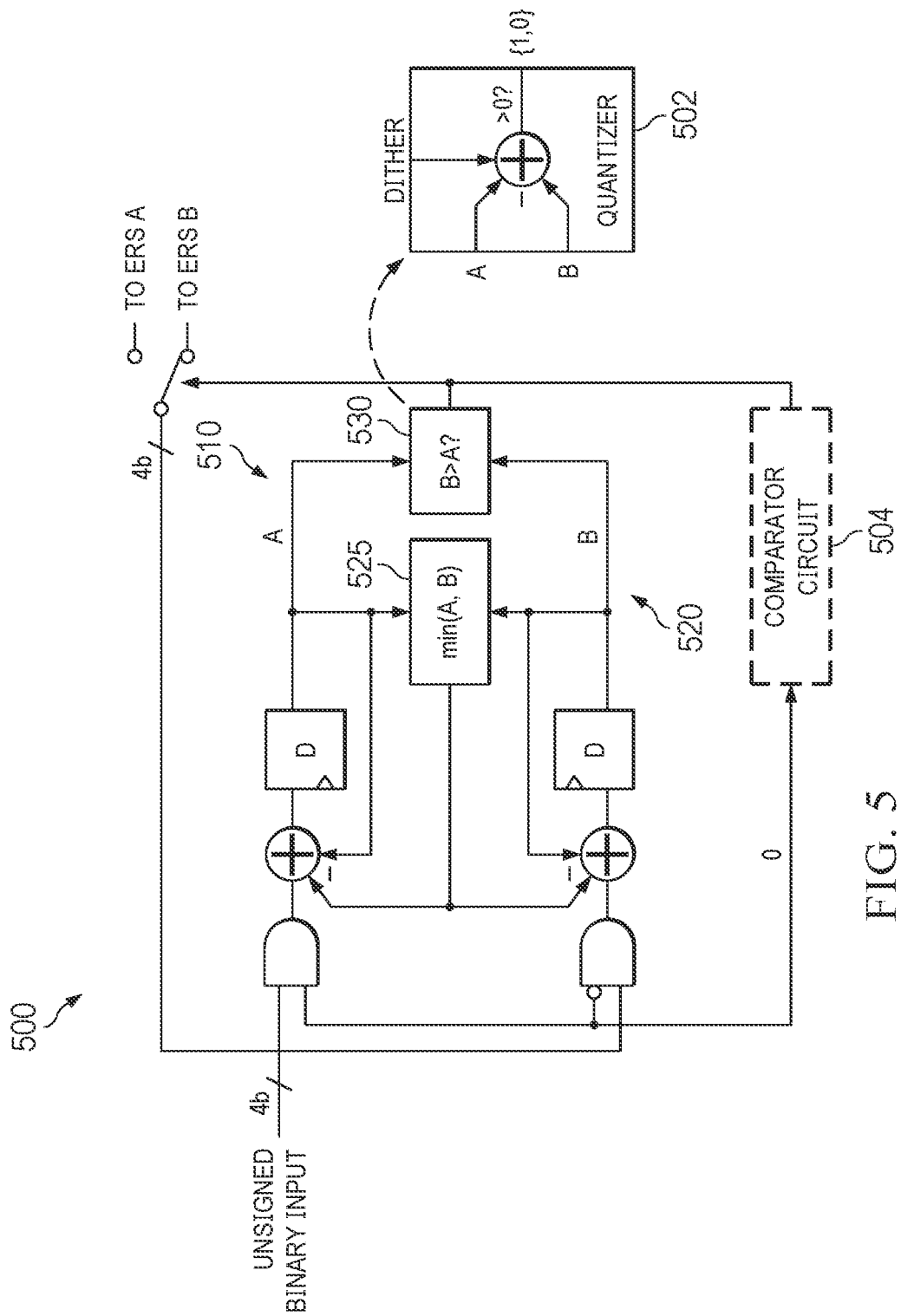
FIG. 5 is a simplified block diagram of an example data-weight sigma-delta (IA), according to some embodiments of the present disclosure.

FIG. 5 is a simplified block diagram of an example data-weight ΣΔ 500 according to some embodiments of the present disclosure. This particular example helps to highlight some of the operational capabilities of the system. In operation, the loop within data weight ΣΔ 500 is used to record the difference between path A and path B. The circuit further attempts to ensure that the integral of the difference approaches 0 over time. This can be accomplished by finding the integral of A (generally indicated at an arrow 510) and also finding the integral of B (generally indicated at an arrow 520). If B is greater than A such that B is leading A (this comparison being indicated generally at an arrow 530), then the data would be redirected to A and, further, the system can force the feedback in such a way to reduce the contents of the two integrators in the correct direction. Hence, in this example, the content would be increased in the direction of A, while the content is also being decreased in the direction of B.

As is illustrated, for the quantizer out operation [in the case of 1] B is leading A, and the circuit would direct data to ERS A. Alternatively, [in the case of 0] A is leading B, and the circuit would direct data to ERS B. The opposite operations would also be effectively achieved, as is being illustrated by a comparator circuit 504. The resultant would ensure that ERS A and ERS B receive equal (or, at least substantially equal) data weight over time. Additionally, a dither 502 can be added to ensure tone free activity in the decision sequence, which is representing the output of the quantizer.

In one example implementation, A min (A,B) element 525 is also provided in one possible configuration of FIG. 5. If each of the integrators continue running freely, where the corresponding bus would be limited by +15 and 0, then a respective ceiling and floor could naturally occur. A mathematical function can be used in this architecture such that if two integrators are running, then their difference can be used by the circuit (e.g., 6 and 5 with a difference of 1). Stated otherwise, 5 is common to both of these terms identified (6,5) to normalize the result back to 1. Hence, taking the minimum of both A and B and subtracting that from both can avoid the integrators experiencing problems (such as wraparound processing, which would be undesirable).

Figure 6:
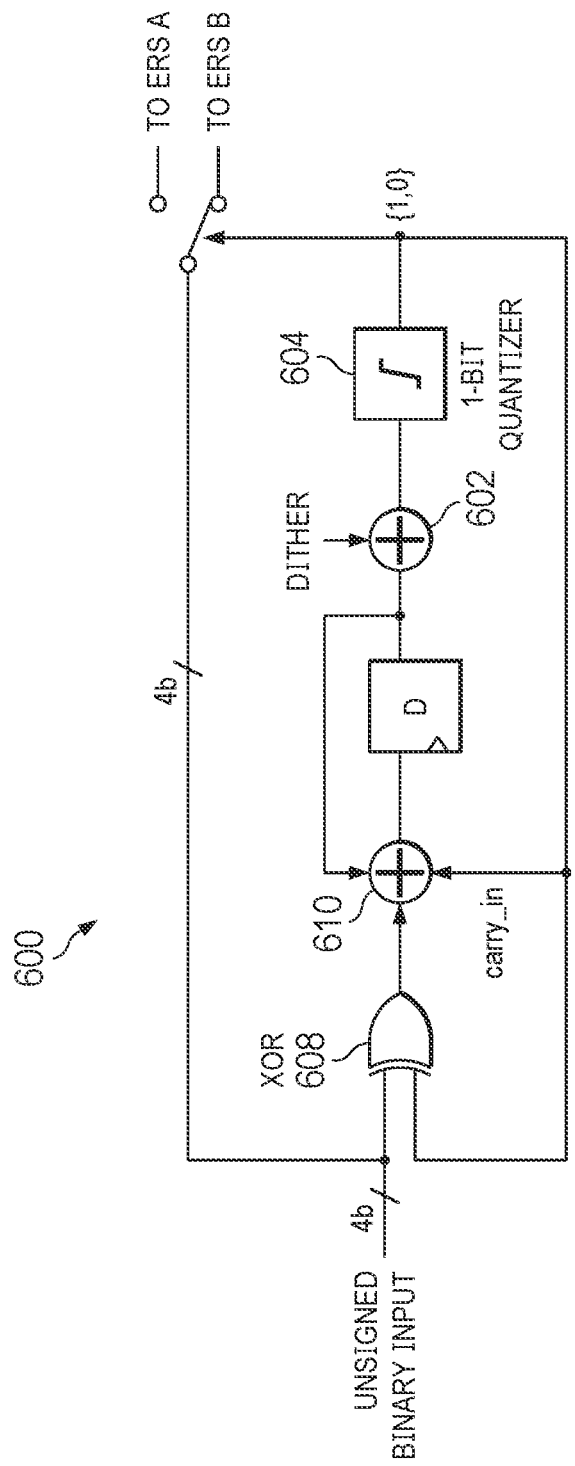
FIG. 6 is a simplified block diagram of an example of a slightly more compact data-weight $\Sigma\Delta$, according to some embodiments of the present disclosure.

FIG. 6 is a simplified block diagram of an example of a more compact data-weight ΣΔ circuit 600 according to some embodiments of the present disclosure. For the architecture of FIG. 6, the implementation can integrate A and B, where two integrators can be appropriately subtracted. Subsequently, the data can be taken out for each of the paths, as is described above with reference to FIG. 5. In the case of FIG. 6, a more compact way of performing these activities would be to take the difference between A and B initially before even being integrated. This is why an XOR gate 608 is being used (taking the 1's complement of the input and then it becomes the carry in). This achieves a 2's complement of the input, as is shown. Additionally, a dither 602 and a 1-bit quantizer 604 are used in a manner consistent with the architecture of FIG. 5. For the quantizer out, if 1: B is ahead of A, the circuit would direct data to ERS A. Additionally, when 0: A is ahead of B, then the circuit would direct data to ERS B. Hence, in comparison to the architecture of FIG. 5, the two integrators would collapse into a single integrator, where an integrator 610 can work on the difference between the two data streams. In one generic, non-limiting sense, the framework of FIG. 6 can be seen as achieving a multibit version of an Adam's cell.

Figure 7:
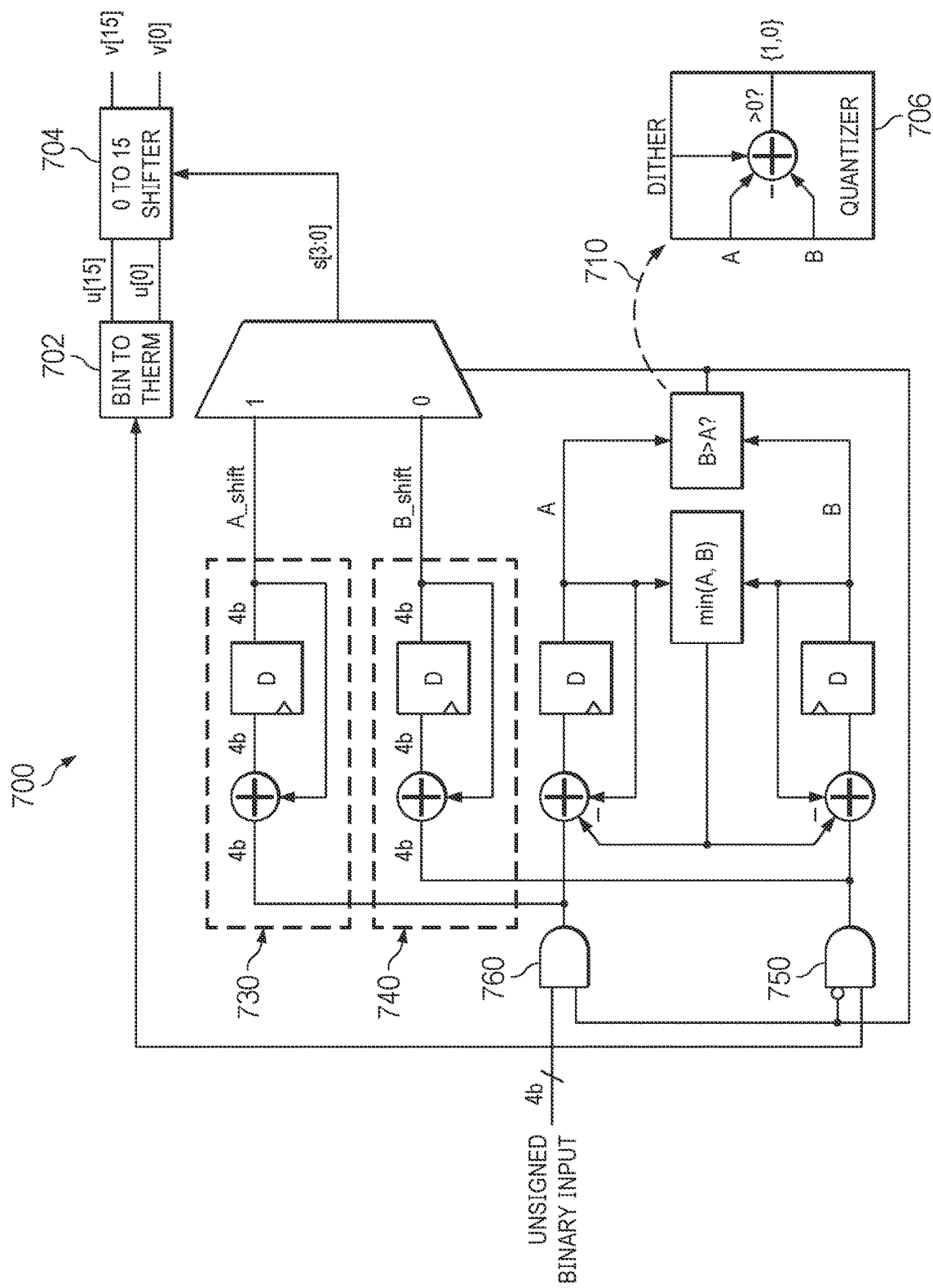
FIG. 7 is a simplified block diagram of an example circuit associated with one implementation of a data-weighted time-interleaved element rotation for mismatch shaping, according to some embodiments of the present disclosure.

FIG. 7 is a simplified schematic diagram according to one embodiment of the present disclosure. A circuit is generally indicated with an arrow 700, which includes a portion of an architecture associated with ERS A (indicated generally at an arrow 730) and ERS B (indicated generally at an arrow 740). Each of these ERSs can function as a simple 4-bit integrator. Additionally, each of their respective outputs can form the respective pointers for A and B, as shown. If A is selected, then the system would disable the path for B and vice versa, which is implicit in the illustration based on the logic gates (i.e., any suitable set of logic gates 750 and 760 can be used to achieve this result by zeroing out the data). In one example implementation, the configuration of FIG. 7 avoids altering the clock. Other embodiments could readily adjust the clock based on particular configuration needs.

Figure 8:
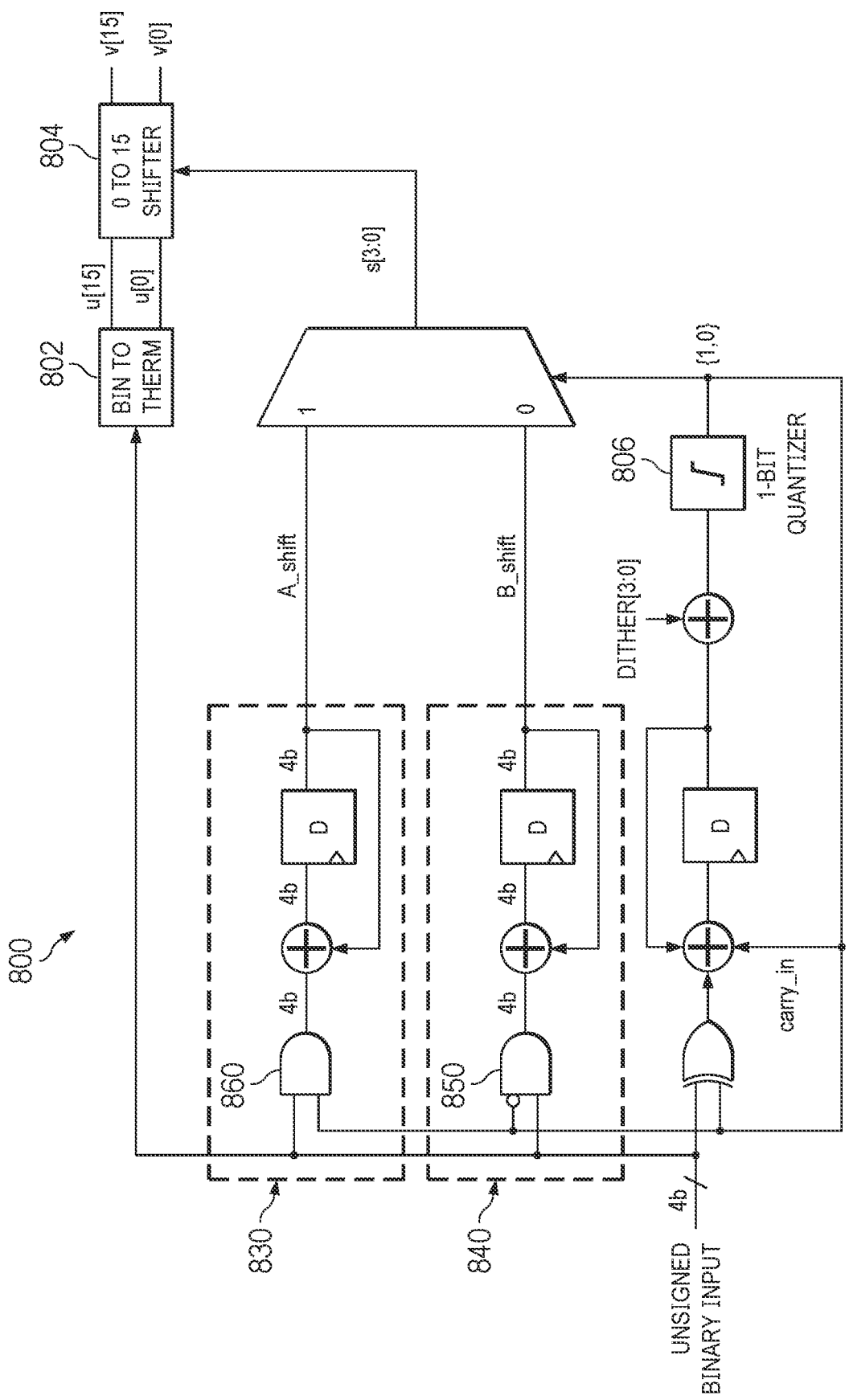
FIG. 8 is a simplified block diagram of an example circuit associated with a compact implementation of the data-weighted time-interleaved element rotation for mismatch shaping, according to some embodiments of the present disclosure.

The input for this architecture (as well as many of the architectures discussed herein) could include any DC forms (e.g., slow acceleration, full scale acceleration, little acceleration, etc.) or any AC forms (e.g., vibration). FIG. 7 also includes a Bin to therm element 702, a barrel shifter 704, which together can be common to ERS A and ERS B (where only one of these is being used at any given time). Also provided in this illustration is a dither 706, which has a link 710 to a comparator for B and A. In one example implementation, dither 706 has the same signal width as the B and A signals (about four for its bandwidth because it runs from the same clock signal), while the amplitude is only 1 or 2 lower sidebands (LSBs) in this non-limiting example, FIG. 8 illustrates a simplified schematic diagram according to one embodiment of the present disclosure. A circuit is generally indicated at an arrow 800, where FIG. 8 is depicting a compact implementation of the present disclosure that operates in a manner similar to that of FIG. 7. In this non-limiting example, FIG. 8 includes a portion of a circuit associated with ERS A (indicated generally at an arrow 830) and ERS B (indicated generally at an arrow 840). Each of these can function as a simple 4-bit integrator in this example configuration. Each of their respective outputs can form the respective pointers for A and B, as is being shown. If A is selected, then the system would disable the path for B and vice versa, which is implicit in the illustration based on the logic gates (i.e., any suitable set of logic gates 850 and 860 can be used to achieve this result by zeroing out the data). Consistent with the explanation above, in one example scenario, such a configuration could avoid altering the clock. Other embodiments could readily make adjustments to the clock based on particular circuit needs.

FIG. 8 also includes a Bin to therm element 802 and a 0 to 15 shifter 804, which together are common to ERS A and ERS B (where only one of these is being used at a time). Also provided in this illustration is a 1-bit quantizer 806, which has a link to a dither [3:0] in this example implementation. In one embodiment, the quantizer out=1 denotes B_shift being used more than A_shift. Additionally, when the integrator content=0, then A and B have been used somewhat equally.

Figure 9:
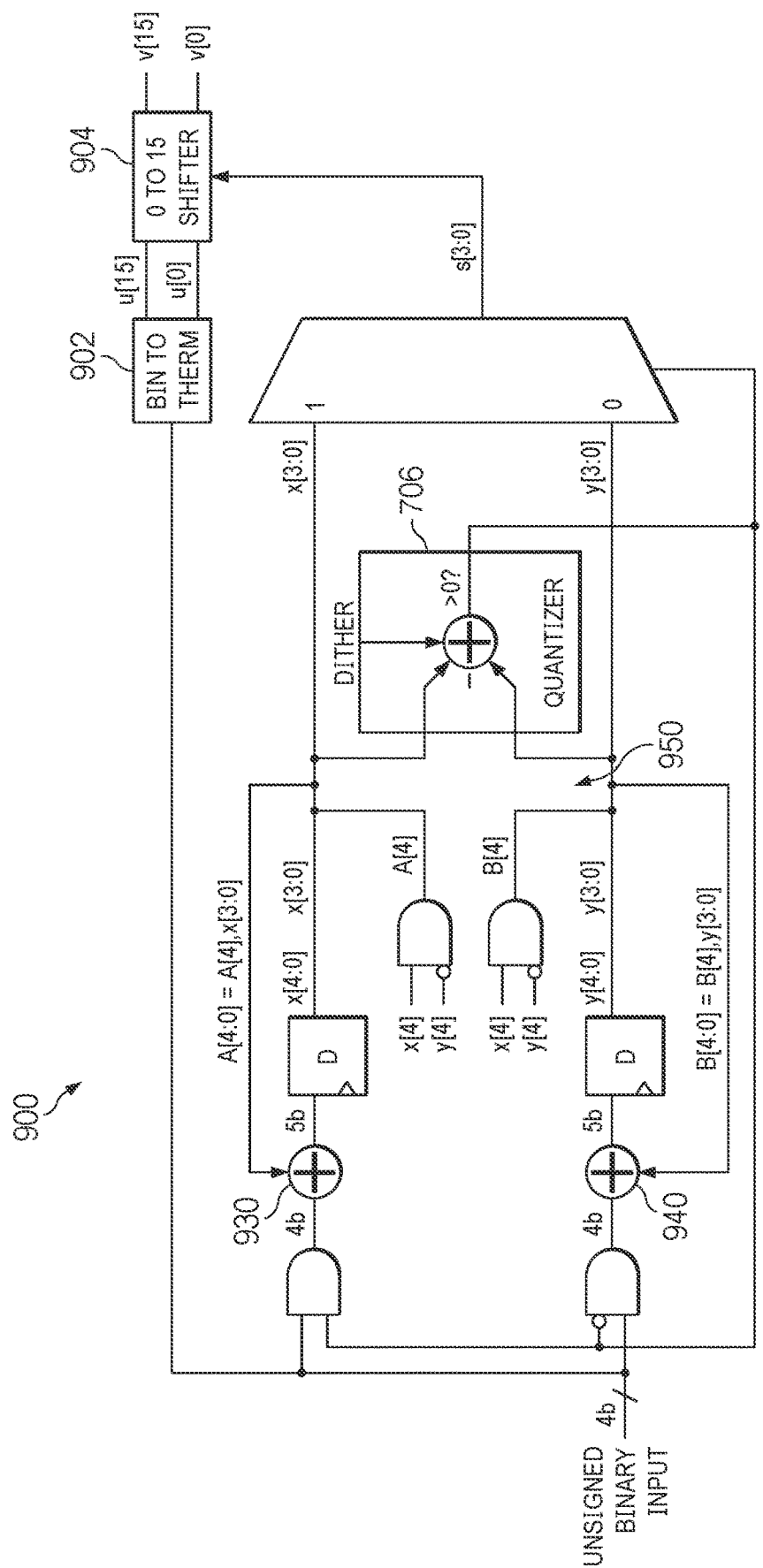
FIG. 9 is a simplified block diagram of an alternative circuit associated with one implementation of a data-weighted time-interleaved element rotation for mismatch shaping, according to some embodiments of the present disclosure.

FIG. 9 is a simplified block diagram of an alternative circuit associated with one implementation of a data-weighted time-interleaved element rotation for mismatch shaping, according to some embodiments of the present disclosure. The architecture of FIG. 9 (generally indicated at an arrow 900) illustrates one example implementation in which there are two integrators (930, 940) being used in conjunction with a dither 906, a 0-15 shifter 904, and a Bin to therm 902. In at least one general sense, the logic being shown at an arrow 950 is being used to loop back into a weighted system as described herein. This architecture could be considered as a more simplified version of the previously discussed architectures for achieving the data weighted operations detailed herein. More specifically, the architecture operates to compare how much ERS A and ERS B are being used. Subsequently, the system can output a decision in order to better steer incoming signals to a more appropriate pathway that is less used. This could be implemented in two DAC systems, three DAC systems, etc. In one example implementation, the A and B bus can be expanded to a 6-bit configuration in order to properly accommodate the dithering activities, which are optional in the scenarios presented herein. In certain implementations that are more stochastic in nature, there could be a minimal level of idle tones to be accounted for.

Simulation Results

Figure 10:
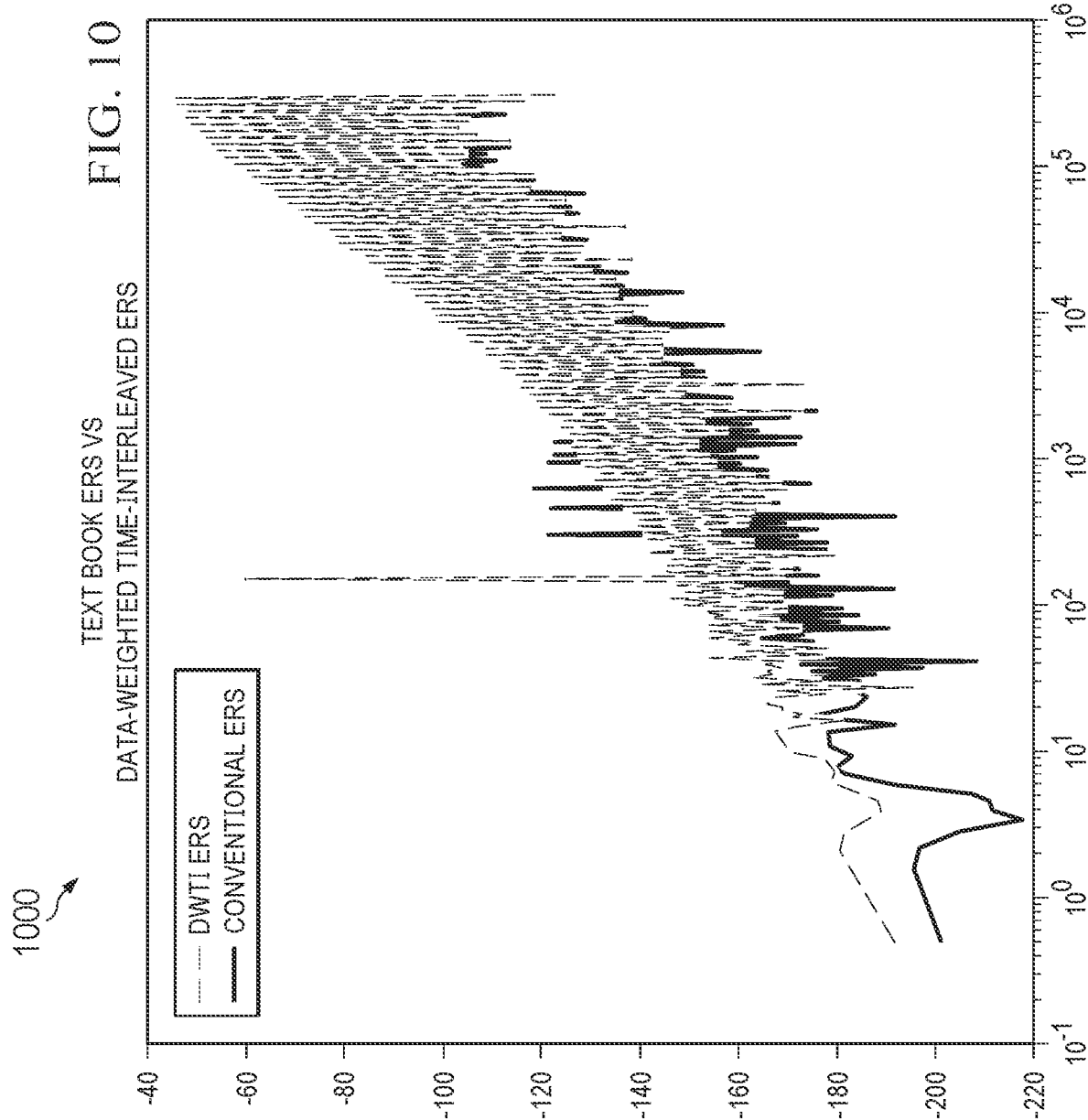
FIG. 10 illustrates a simulation result for one example implementation of the data-weighted time-interleaved element rotation for mismatch shaping, according to certain embodiments of the present disclosure.
Figure 11:
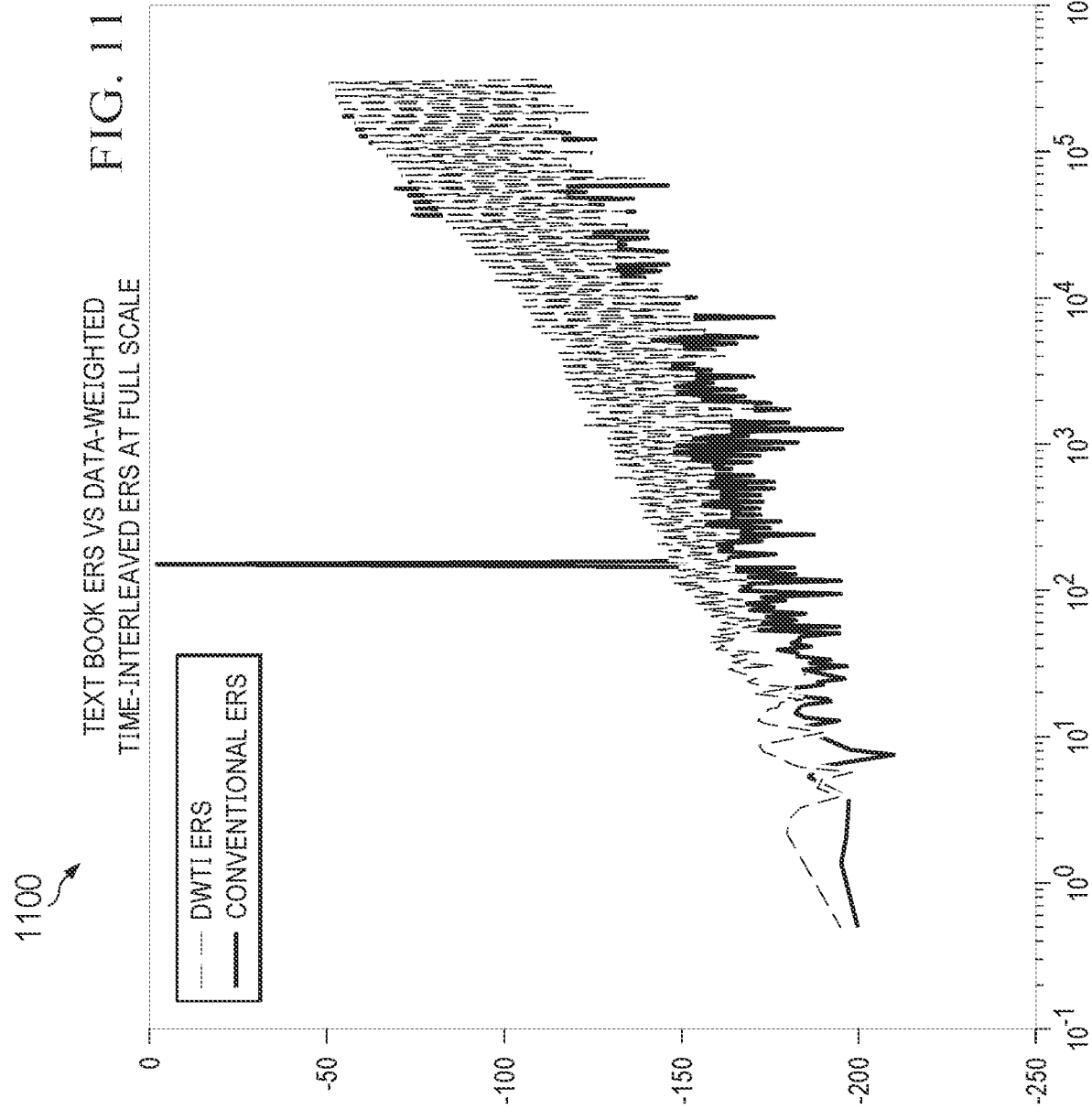
FIG. 11 illustrates another simulation result for one example implementation of the data-weighted time-interleaved element rotation for mismatch shaping, according to certain embodiments of the present disclosure.

FIG. 10 illustrates a simulation result 1000 for an example implementation of the present disclosure. Specifically, FIG. 10 illustrates conventional ERS being plotted against data-weighted time-interleaved (DWTI) ERS operations. A dashed line depicts the DWTI ERS, as it ascends in the graph. Underneath the DWTI ERS is the conventional ERS. This simulation result is being taken at −60 dBFS in this example. In a similar fashion, FIG. 11 illustrates a simulation result 1100 at full scale input for this example implementation of the present disclosure. Consistent with FIG. 10, DWTI ERS is outperforming the underlying convention ERS as expected.

Figure 12:
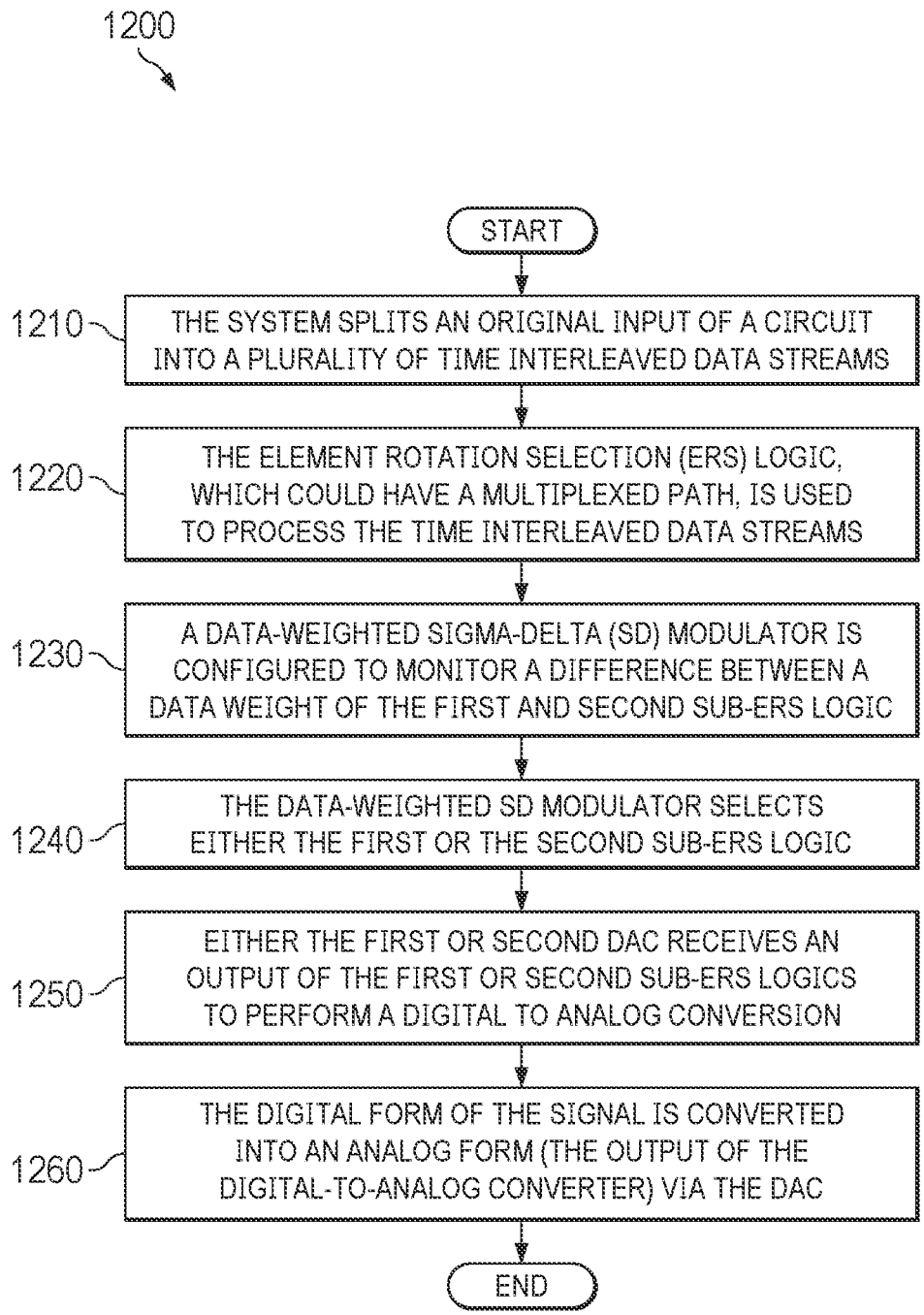
FIG. 12 illustrates a simplified flowchart associated with one example implementation of the data-weighted time-interleaved element rotation for mismatch shaping, according to certain embodiments of the present disclosure.

FIG. 12 is a simplified flowchart 1200 associated with one example implementation of the data-weighted time-interleaved element rotation for mismatch shaping, according to certain embodiments of the present disclosure. This particular flow may begin at 1210 in which the system splits an original input of a circuit into a plurality of time interleaved data streams. At 1220, ERS logic, which could have a multiplexed path, can be used to process the time interleaved data streams. At 1230, a data-weighted sigma-delta modulator can monitor a difference between a data weight of the first and second sub-ERS logic. At 1240, the data-weighted SD modulator selects either the first or the second sub-ERS logic. At 1250, either the first or second DAC receives an output of the first or second sub-ERS logics to perform a digital to analog conversion. At 1260, the digital form of the signal is converted into an analog form (the output of the digital-to-analog converter) via the DAC.

Exemplary Data Processing System

Figure 13:
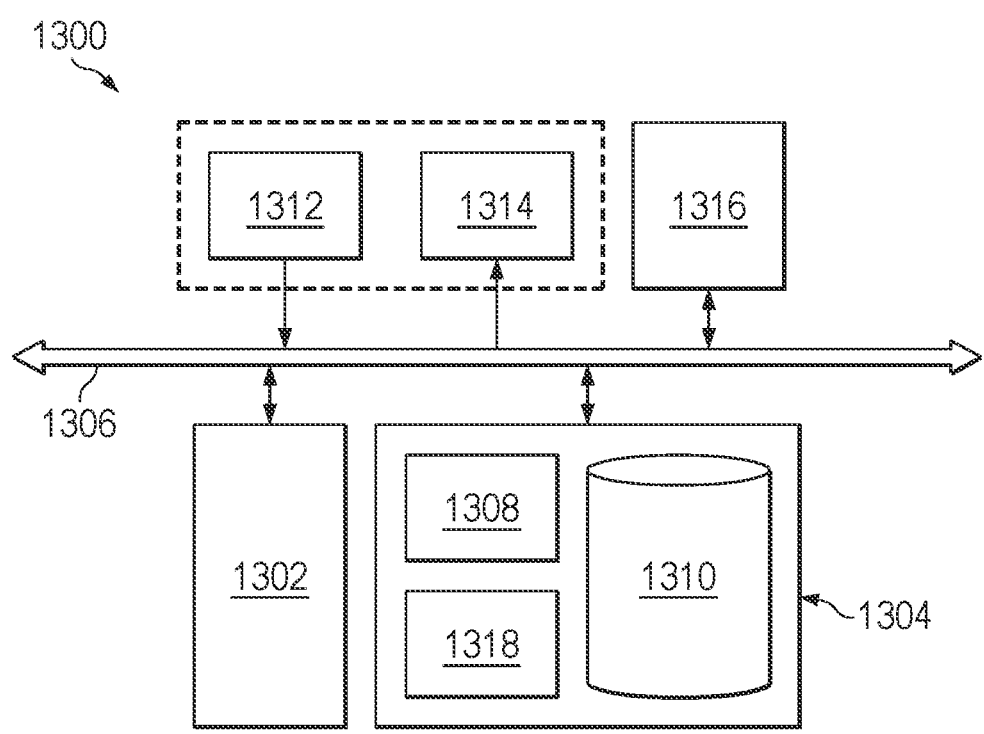
FIG. 13 is a simplified circuit diagram illustrating one example implementation of the data-weighted time-interleaved element rotation for mismatch shaping, according to certain embodiments of the present disclosure.

FIG. 13 is a simplified circuit diagram 1300 illustrating one example implementation of the data-weighted time-interleaved element rotation for mismatch shaping, according to certain embodiments of the present disclosure. Such a data processing system could be configured to function as the circuits described herein or as any other system configured to implement various improved mechanisms related to element matching techniques as described herein.

As shown in FIG. 13, the data processing system 1300 may include at least one processor 1302 coupled to memory elements 1304 through a system bus 1306. As such, the data processing system may store program code within memory elements 1304. Further, the processor 1302 may execute the program code accessed from the memory elements 1304 via a system bus 1306. In one aspect, the data processing system may be implemented as a computer that is suitable for storing and/or executing program code. It should be appreciated, however, that the data processing system 1300 may be implemented in the form of any system including a processor and a memory that is capable of performing the functions described within this specification.

The memory elements 1304 may include one or more physical memory devices such as, for example, local memory 1308 and one or more bulk storage devices 1310. The local memory may refer to random access memory or other non-persistent memory device(s) generally used during actual execution of the program code. A bulk storage device may be implemented as a hard drive or other persistent data storage device. The processing system 1300 may also include one or more cache memories (not shown) that provide temporary storage of at least some program code in order to reduce the number of times program code must be retrieved from the bulk storage device 1310 during execution.

Input/output (I/O) devices depicted as an input device 1312 and an output device 1314, optionally, can be coupled to the data processing system. Examples of input devices may include, but are not limited to, a keyboard, a pointing device such as a mouse, or the like. Examples of output devices may include, but are not limited to, a monitor or a display, speakers, or the like. Input and/or output devices may be coupled to the data processing system either directly or through intervening I/O controllers.

In an embodiment, the input and the output devices may be implemented as a combined input/output device (illustrated in FIG. 13 with a dashed line surrounding the input device 1312 and the output device 1314). An example of such a combined device is a touch sensitive display, also sometimes referred to as a "touch screen display" or simply "touch screen". In such an embodiment, input to the device may be provided by a movement of a physical object, such as e.g., a stylus or a finger of a user, on or near the touch screen display.

A network adapter 1316 may also, optionally, be coupled to the data processing system to enable it to become coupled to other systems, computer systems, remote network devices, and/or remote storage devices through intervening private or public networks. The network adapter may comprise a data receiver for receiving data that is transmitted by said systems, devices and/or networks to the data processing system 1300, and a data transmitter for transmitting data from the data processing system 1300 to said systems, devices and/or networks. Modems, cable modems, and Ethernet cards are examples of different types of network adapter that may be used with the data processing system 1300.

As pictured in FIG. 13, the memory elements 1304 may store an application 1318. In various embodiments, the application 1318 may be stored in the local memory 1308, the one or more bulk storage devices 1310, or apart from the local memory and the bulk storage devices. It should be appreciated that the data processing system 1300 may further execute an operating system (not shown in FIG. 13) that can facilitate execution of the application 1318. The application 1318, being implemented in the form of executable program code, can be executed by the data processing system 1300, e.g., by the processor 1302. Responsive to executing the application, the data processing system 1300 may be configured to perform one or more operations or method steps described herein.

VARIATIONS AND IMPLEMENTATIONS

While embodiments of the present disclosure were described above with references to exemplary implementations as shown in FIGS. 1-13, a person skilled in the art will realize that the various teachings described above are applicable to a large variety of other implementations. For example, while some descriptions provided in the present disclosure refer to thermometer coding, these descriptions are equally applicable to other coding methods used in DACs. Further, while examples provided herein are described with reference to a DAC comprising 8 or 16 DAC units, of course in other implementations any other number of DAC units could be used.

Embodiments of the present disclosure may be particularly advantageous for oversampling, or interpolating, DACs, such as e.g., sigma-delta DACs, because of their high speed. However, the techniques presented herein are not limited to oversampling DACs as they are equally applicable, possibly with modifications that would be apparent to a person of ordinary skill in the art, to other types of DACs, such as e.g., Nyquist DACs.

Furthermore, while only current steering DACs are illustrated in the FIGURES, embodiments of the present disclosure are equally applicable to other circuit architectures, e.g., to switched capacitor DACs. In switched capacitor DACs, DAC cells not selected for the conversion of digital input values and application of DEM techniques may be connected to reference voltages.

Besides being particularly advantageous for three-level DACs, embodiments of the present disclosure are applicable to two-level DACs, implemented using either current steering or switched capacitor architecture. For two-level switched capacitor DAC architectures, implementation of some embodiments of the present disclosure may allow saving dynamic power drawn from reference voltage. For two-level current steering DAC architectures, implementation of some embodiments of the present disclosure may allow reducing dynamic mismatch error.

Still further, embodiments of the present disclosure may be used in stand-alone DACs as well as in embedded feedback DACs in analog-to-digital converter (ADC) designs.

In certain contexts, the features discussed herein can be applicable to automotive systems, safety-critical industrial applications, medical systems, scientific instrumentation, wireless and wired communications, radar, industrial process control, audio and video equipment, current sensing, instrumentation (which can be highly precise), and other digital-processing-based systems.

Moreover, certain embodiments discussed above can be provisioned in digital signal processing technologies for medical imaging, patient monitoring, medical instrumentation, and home healthcare. This could include pulmonary monitors, accelerometers, heart rate monitors, pacemakers, etc. Other applications can involve automotive technologies for safety systems (e.g., stability control systems, driver assistance systems, braking systems, infotainment and interior applications of any kind).

In yet other example scenarios, the teachings of the present disclosure can be applicable in the industrial markets that include process control systems that help drive productivity, energy efficiency, and reliability. In consumer applications, the teachings of the signal processing circuits discussed above can be used for image processing, auto focus, and image stabilization (e.g., for digital still cameras, camcorders, etc.). Other consumer applications can include audio and video processors for home theater systems, DVD recorders, and high-definition televisions.

In the discussions of the embodiments above, components of a system, such as e.g., clocks, multiplexers, buffers, and/or other components can readily be replaced, substituted, or otherwise modified in order to accommodate particular circuitry needs. Moreover, it should be noted that the use of complementary electronic devices, hardware, software, etc. offer an equally viable option for implementing the teachings of the present disclosure related to improved switching techniques.

Parts of various systems for implementing improved mechanisms for applying data-weighted element matching techniques as proposed herein can include electronic circuitry to perform the functions described herein. In some cases, one or more parts of the system can be provided by a processor specially configured for carrying out the functions described herein. For instance, the processor may include one or more application specific components, or may include programmable logic gates which are configured to carry out the functions describe herein. The circuitry can operate in analog domain, digital domain, or in a mixed signal domain. In some instances, the processor may be configured to carrying out the functions described herein by executing one or more instructions stored on a non-transitory computer readable storage medium.

In one example embodiment, any number of electrical circuits of FIGS. 1-13 may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of FIGS. 3-13 may be implemented as stand-alone modules (e.g., a device with associated components and circuitry configured to perform a specific application or function) or implemented as plug-in modules into application specific hardware of electronic devices. Note that particular embodiments of the present disclosure implementing improved mechanisms for applying data-weighted element matching techniques may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the functionalities of improved mechanisms for applying data-weighted element matching techniques proposed herein may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of FIGS. 3-13 may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of FIGS. 3-13 and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It is also important to note that the functions related to the improved mechanisms for applying data-weighted element matching techniques as proposed herein illustrate only some of the possible functions that may be executed by, or within, system illustrated in FIGS. 3-13. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the appended claims.

Although the claims are presented in single dependency format in the style used before the USPTO, it should be understood that any claim can depend on and be combined with any preceding claim of the same type unless that is clearly technically infeasible.

Note that all optional features of the apparatus described above may also be implemented with respect to the method or process described herein and specifics in the examples may be used anywhere in one or more embodiments.

What is claimed is:

1. A method for mismatch shaping for a digital to analog converter, the method comprising:
   splitting an original input of a circuit into a plurality of time interleaved data streams;
   directing one of the plurality of time interleaved data streams to element rotation selection (ERS) logic according to a decision of a data-weighted sigma-delta (SD) modulator; and
   processing, using the ERS logic, the directed one of the plurality of time interleaved data streams.

2. The method of claim 1, further comprising:
   multiplexing the plurality of time interleaved data streams; and
   providing an output of the multiplexing to a barrel shifter.

3. The method of claim 1, further comprising:
   monitoring a difference between the plurality of time interleaved data streams as a basis for the directing such that a data sample rate for the digital to analog converter is reduced over a time interval.

4. The method of claim 1, further comprising:
   disabling a path associated with one of the plurality of time interleaved data streams such that content associated with the path is zeroed out.

5. The method of claim 1, wherein processing, using the ERS logic, the directed one of the time interleaved data streams includes:
   processing, using multiple ERS logic, corresponding directed ones of the plurality of data interleaved streams.

6. The method of claim 1, further comprising:
   driving, using an ERS logic output, a digital-to-analog converter (DAC) unit for analog reconstruction.

7. The method of claim 1, comprising:
   multiplexing the plurality of time interleaved data streams.

8. The method of claim 1, comprising:
   providing an output of a multiplexer to a barrel shifter.

9. An element rotation selection (ERS) system for mismatch shaping, the ERS system comprising:
   a first sub-ERS logic;
   a second sub-ERS logic;
   a first DAC coupled to the first sub-ERS logic;
   a second DAC coupled to the second sub-ERS logic, wherein the first and second DACs are to receive an output of the first and second sub-ERS logics to perform a digital to analog conversion; and
   a data-weighted sigma-delta (SD) modulator configured to:
      monitor a difference between a data weight of the first and second sub-ERS logic; and
      select either the first or the second sub-ERS logic to maintain substantially equal usage over time between the first sub-ERS logic and the second sub-ERS logic.

10. The ERS system of claim 9, wherein the data-weighted SD modulator provides that input weights that move toward two different branches within the ERS system are substantially equal over time.

11. The ERS system of claim 9, wherein an output at the first and second sub-ERS logic is in a digital form that is being converted into an analog form via the first and second DACs.

12. The ERS system of claim 9, wherein the first sub-ERS logic and the second sub-ERS logic drive resultants for the first DAC and the second DAC.

13. The ERS system of claim 9, wherein if one of the first and second sub-ERS logic is not used, its corresponding content is not updated.

14. The ERS system of claim 9, wherein the first DAC and the second DAC are a same physical DAC.

15. The ERS system of claim 9, further comprising:
   a dither to provide a tone free result for a decision sequence associated with the selection of the first or the second sub-ERS logic.

16. A non-transitory computer readable storage medium storing software code portions configured, when executed on a processor, for mismatch shaping for a digital to analog converter, by:
   splitting an original input of a circuit into a plurality of time interleaved data streams;

directing one of the plurality of time interleaved data streams to element rotation selection (ERS) logic according to a decision of a data-weighted sigma-delta (SD) modulator; and processing, using the ERS logic, the directed one of the plurality of time interleaved data streams.

17. The non-transitory computer readable storage medium according to claim 16, wherein the software code portions are further configured for:

multiplexing the plurality of time interleaved data streams; and providing an output of the multiplexing to a barrel shifter.

18. The non-transitory computer readable storage medium according to claim 16, wherein the ERS logic shares a portion of hardware in which selection code to a barrel shifter is multiplexed, and wherein processing, using the ERS logic, the directed one of the plurality of time interleaved data streams includes:

processing, using multiple ERS logic, corresponding directed ones of the plurality of time interleaved data streams.

19. The non-transitory computer readable storage medium according to claim 16, wherein the software code portions are further configured for:

monitoring a difference between the plurality of time interleaved data streams as a basis for the directing such that a data sample rate for the digital to analog converter is reduced over a time interval.

20. The non-transitory computer readable storage medium according to claim 16, wherein the software code portions are further configured for:

providing an output of a multiplexer to a barrel shifter.

* * * * *